(12) United States Patent
Moscaluk et al.

(10) Patent No.: US 7,173,475 B1
(45) Date of Patent: Feb. 6, 2007

(54) SIGNAL TRANSMISSION AMPLIFIER CIRCUIT

(75) Inventors: Gary Peter Moscaluk, Colorado Springs, CO (US); John Eric Gross, Monument, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/797,147

(22) Filed: Mar. 10, 2004

Related U.S. Application Data

(60) Provisional application No. 60/457,751, filed on Mar. 26, 2003.

(51) Int. Cl.
*H03K 17/30* (2006.01)

(52) U.S. Cl. ......................... 327/379; 327/383; 327/384

(58) Field of Classification Search ................ 327/198, 327/199, 205, 208, 222, 228, 203, 175, 215; 365/145
See application file for complete search history.

(56) References Cited

U.S. PATENT DOCUMENTS

| | | | | |
|---|---|---|---|---|
| 5,107,465 A | * | 4/1992 | Fung et al. ............ 365/230.08 |
| 5,140,179 A | * | 8/1992 | Takano ........................ 327/203 |
| 5,173,870 A | * | 12/1992 | Sukashita et al. ........... 708/625 |
| 5,359,232 A | * | 10/1994 | Eitrheim et al. ............ 327/116 |
| 5,487,037 A | * | 1/1996 | Lee ........................ 365/189.11 |
| 5,557,225 A | * | 9/1996 | Denham et al. ............ 327/199 |
| 5,696,719 A | * | 12/1997 | Baek et al. ............ 365/189.05 |
| 5,949,256 A | * | 9/1999 | Zhang et al. .................. 327/57 |
| 6,008,673 A | * | 12/1999 | Glass et al. .................... 327/77 |
| 6,437,624 B1 | * | 8/2002 | Kojima et al. ............... 327/211 |
| 6,563,356 B2 | * | 5/2003 | Fulkerson .................... 327/203 |
| 6,747,485 B1 | * | 6/2004 | Suryanarayana et al. ..... 327/51 |
| 6,836,426 B1 | * | 12/2004 | Fukushi et al. ............. 365/145 |
| 6,870,413 B1 | * | 3/2005 | Chang et al. ................ 327/205 |

* cited by examiner

*Primary Examiner*—Tuan T. Lam
*Assistant Examiner*—Hiep Nguyen
(74) *Attorney, Agent, or Firm*—Dale B. Halling

(57) ABSTRACT

A signal transmission amplifier circuit has a transmission gate with an input coupled to an input signal. A cross coupled latch is coupled to an output of the transmission gate and has a signal output. A reference generating circuit is coupled to the cross coupled latch.

15 Claims, 3 Drawing Sheets

SIGNAL TRANSMISSION AMPLIFIER CIRCUIT

RELATED APPLICATIONS

The present invention claims priority on provisional patent application Ser. No. 60/457,751, filed on Mar. 26, 2003, entitled "Single Ended Self-Referencing Amplifier For Fast Signal Transfer" and assigned to the same assignee as the present application.

FIELD OF THE INVENTION

The present invention relates generally to the field of electronic circuits and more particularly to a signal transmission amplifier circuit.

BACKGROUND OF THE INVENTION

In electronic circuits, a challenge faced by designers is the transfer of signals over long distances, for example across an integrated circuit die or 'chip'. The traces or metal lines that conduct these signals across a die may be long, and have associated parasitic resistances and capacitance effects. The result of these parasitic effects can be slow signal transitions, and require the use of powerful driver circuits.

A conventional solution to this challenge comprises using large drivers to drive long parasitic lines and repeaters to improve signal transfer. The combination of parasitic resistance in series and parallel capacitance to ground creates a large RC time constant. This can delay the rate of signal transfer due to slow transitions from the large RC delays and result in low voltage levels and decreased transistor drive which reduces high speed performance. The use of very large drivers or repeaters (buffers) increases power consumption with diminishing returns on speed improvement.

Thus there exists a need for a signal transmission amplifier that increases the transmission speed of a signal and has fast transition times.

SUMMARY OF INVENTION

A signal transmission amplifier circuit that overcomes these and other problems has a transmission gate with an input coupled to an input signal. A cross coupled latch is coupled to an output of the transmission gate and has a signal output. A reference generating circuit is coupled to the cross coupled latch. In one embodiment, a strobe signal is coupled to the transmission gate. In one aspect of the invention, the strobe signal is coupled to the cross coupled latch.

In one embodiment, the reference generating circuit includes a Schmitt trigger. In one aspect of the invention, the reference generating circuit includes a latch coupled to the Schmitt trigger. The circuit may include a second transmission gate between the output of the latch and the cross coupled latch.

In one embodiment, the input signal is a single ended input. The input of the transmission gate may be coupled to a transmission line.

In one embodiment, a signal transmission amplifier circuit has a transmission gate with an input. A latch is coupled to an output of the transmission gate with a reference input. In one embodiment, the latch is a cross coupled latch. The transmission gate may be coupled to a strobe signal and an inverted strobe signal. In one aspect of the invention, the cross coupled latch latches on an input signal having a voltage that is less than a transistor threshold. The cross coupled latch may be coupled to a strobe signal. In one embodiment, a reference circuit has a second latch generating the reference input signal.

In one embodiment, a signal transmission amplifier circuit has a cross coupled latch with an input. A reference voltage generating circuit is coupled to the cross coupled latch. In one aspect of the invention, cross coupled latch has a strobe signal input.

In one embodiment, a transmission gate is coupled between the input of the cross coupled latch and an input signal. A transmission gate may be coupled between the reference voltage generating circuit and the cross coupled latch.

In one embodiment, the reference generating circuit includes a latch. In one aspect of the invention, an input signal is a single ended signal.

DETAILED DESCRIPTION OF THE DRAWINGS

Figure 1:
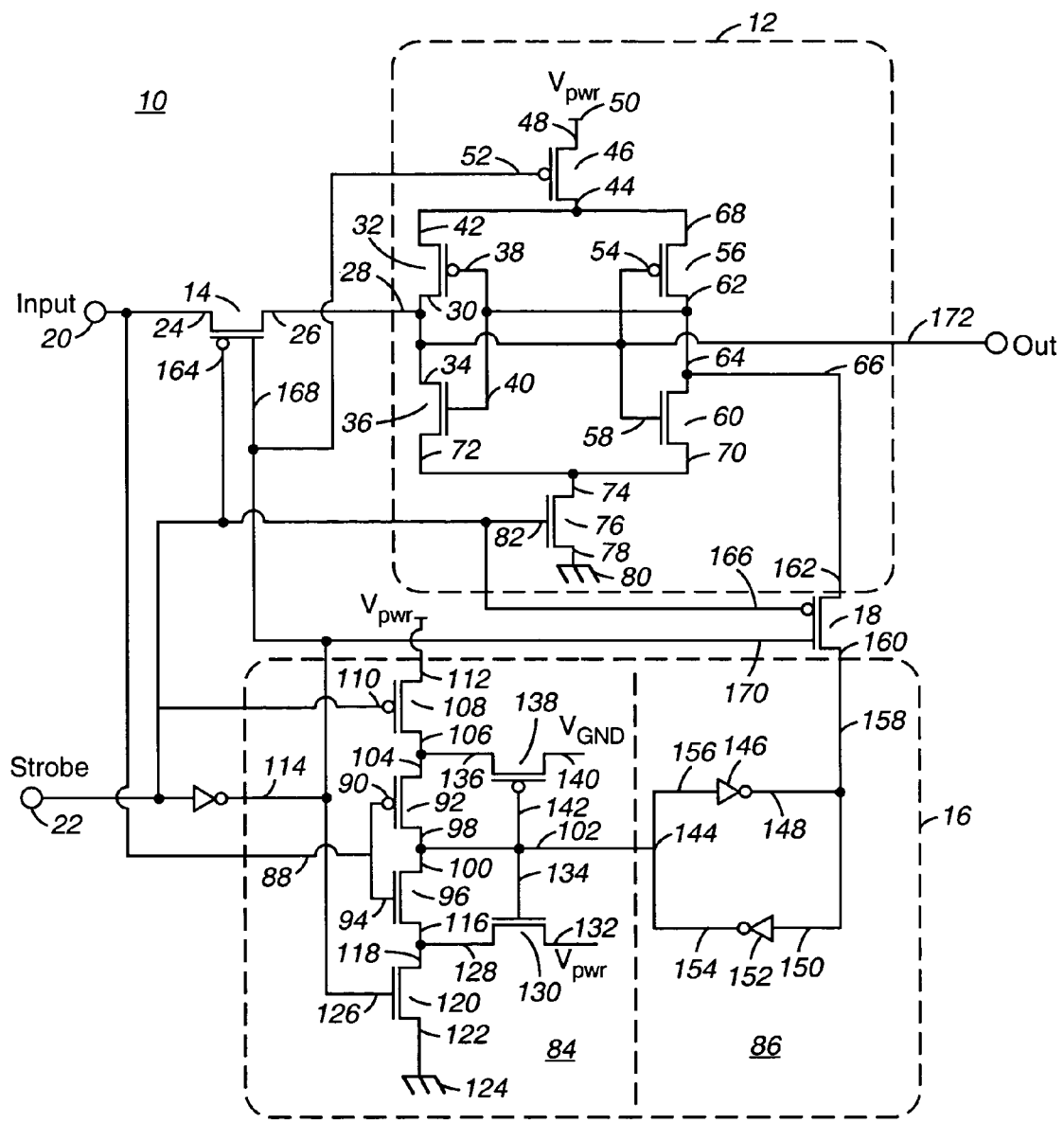
FIG. 1 is a schematic diagram of a signal transmission amplifier circuit in accordance with one embodiment of the invention.

The invention describes a circuit for improving the transmission of a signal across long traces or conductors on an integrated circuit. FIG. 1 is a schematic diagram of a signal transmission amplifier circuit 10 in accordance with one embodiment of the invention. The signal transmission amplifier circuit 10 has four major components. A cross-coupled latched 12, a first transmission gate 14, a reference generating circuit 16 and a second transmission gate 18. The amplifier circuit 10 has two inputs, a signal input 20 and a strobe input 22. The input 20 is coupled to an input 24 of the first transmission gate 14. A transmission gate is formed by connecting the drain of a p-channel transistor to the source of a n-channel transistor and connecting the source of the p-channel transistor to the drain of the n-channel transistor. The output 26 of the first transmission gate 14 is coupled to the cross coupled latch 12. The input 28 of the cross coupled latch 12 is coupled to a drain 30 of a p-channel transistor 32 and the drain 34 of an n-channel transistor 36. The p-channel transistor 32 and the n-channel transistor 36 are connected to form an inverter. The gate 38 of the p-channel transistor 32 is coupled to the gate 40 of the n-channel transistor 36. The source 42 of the p-channel transistor 32 is coupled to drain 44 of p-channel transistor 46. The source 48 of p-channel transistor 46 is coupled to a power supply (VPWR) 50. The gate 52 of the p-channel transistor 46 is coupled to strobe bar (inverted strobe signal).

The input 28 is coupled to gate 54 of p-channel transistor 56 and to the gate 58 of n-channel transistor 60. Note that p-channel transistor 56 and n-channel transistor 60 form a second inverter. The drain 62 of p-channel transistor 56 is coupled to the drain 64 of n-channel transistor 60, and is coupled to the gate 38 of p-channel transistor 32 and to the gate 40 of n-channel transistor 36 and is also coupled to a voltage reference input 66. The source 68 of p-channel transistor 56 is coupled to the drain 44 of p-channel transistor 46. The source 70 of n-channel transistor 60 is coupled to the source 72 of n-channel transistor 36 and the drain 74 of n-channel transistor 76. The source 78 of n-channel transistor 76 is coupled to ground 80. The gate 82 of n-channel transistor 76 is connected to the strobe signal 22.

The input 20 is also coupled to reference generating circuit 16. The reference generating circuit 16 is formed by a Schmitt trigger circuit 84 and a latch 86. The Schmitt trigger circuit 84 has an input 88 coupled to the gate 90 of p-channel transistor 92 and to the gate 94 of n-channel transistor 96. The drain 98 of p-channel transistor 92 is coupled to the drain 100 of n-channel transistor 96 and to the output 102 of the Schmitt trigger. The source 104 of p-channel transistor 92 is coupled to the drain 106 of p-channel transistor 108. The gate 110 of p-channel transistor 108 is coupled to the strobe signal 22. The source 112 of the p-channel transistor 108 is coupled to VPWR. The source 116 of n-channel transistor 96 is coupled to the drain 118 of n-channel transistor 120. The drain 122 of n-channel transistor 120 is coupled to ground 124. The gate 126 of n-channel transistor 120 is coupled to the inverted strobe signal 114. The source 118 of n-channel transistor 120 is coupled to the source 128 of n-channel transistor 130. The drain 132 of n-channel transistor 130 is coupled to the power supply (VPWR). The gate 134 of n-channel transistor 130 is coupled to the output 102. The source 104 of p-channel transistor 92 is coupled to the source 136 of p-channel transistor 138. The drain 140 of p-channel transistor 138 is coupled to ground (VGND). The gate 142 of p-channel transistor 138 is coupled to the output 102.

The output 102 of the Schmitt trigger is coupled to the input 144 of latch 86. The latch 86 has a first inverter 146 with its output 148 coupled to an input 150 of a second inverter 152. The output 154 of the second inverter 152 is coupled to the input 156 of the first inverter 146. The output 158 of the latch 86 and therefore the reference generating circuit is coupled to an input 160 the second transmission gate 18. The output 162 of the transmission gate 18 is coupled to the reference voltage input 66 of the cross coupled latch 12.

Both transmission gates 14 & 18 have their p-channel gates 164 & 166 coupled to the strobe signal 22 and their n-channel gates 168 & 170 coupled to the inverted strobe signal 114. The transmission gates are only active when the strobe signal is low and the subsequent inverted strobe signal is high.

Note that the cross coupled latch 12 could be replaced with a standard latch, however the output would be inverted. The standard latch would also have to have a reference voltage input. The reference generating circuit 16 could use another circuit than the Schmitt trigger to detect the input.

The input signal 20 is a single ended signal such as a clock. However, input signal 20 could also be a single ended signal such as a control line. Or a precharged read or write data line. The transmission gate 14 disconnects the large parasitic RC of the input line. When the strobe signal 22 is low the transmission gate 14 is active and the input voltage is allowed to propagate into the cross coupled latch 12. Note that the p-channel transistor 46 and n-channel transistor 76 are disabled when the transmission gate 14 is active. Thus the transistors 32, 36, 56 & 60 are not conducting. The reference voltage 158 is applied since the transmission gate 18 is active. The reference voltage tracks the previous state.

So if the input signal 20 was low or at VGND. If the input signal 20 is now transitioning toward VPWR, then the strobe signal is driven high and transistors 46 & 76 enable. At the same time, transmission gates 14 and 18 disable, which isolates the differential voltage obtained at the input signals 28 and 66 of the cross-coupled latch. The latch will then sense the differential voltage and drive the output signal 172 to the appropriate logic level. In this case, signal 38 will have a higher voltage than signal 66 based on the input signals voltage level. The reference signal 66 is connected to the gates of PCH transistor 32 and NCH transistor 36. The signal 38 is connected to the gates of PCH transistor 56 and NCH transistor 60. Both drains (42 and 68) of the PCH transistors for the cross-coupled latch are at VPWR and both sources (72 and 70) of the NCH transistors are at VGND. Since signal 38 has a higher voltage with respect to the reference signal 66, then PCH 32 will have a higher gate to source voltage (Vgs) than PCH 56. Furthermore, NCH 60 will have a higher Vgs than NCH 36. As a result, both PCH cross-coupled latch transistors will be operating in the linear region. However, because of the higher Vgs on PCH 32, this transistor will conduct more current than PCH 56 and drive drain 30 towards VPWR. As drain 30 continues to increase in potential, the NCH 60 gate voltage will reach a threshold voltage and subsequently begin operating in the saturation region. Consequently, this event will disable PCH 56 and keep NCH 36 disabled due to the positive feedback of the cross-coupled latch. By disconnecting the input from the cross-coupled latch, the large parasitic RC is removed as a load from the cross-coupled latch. This allows for faster rise and fall times for the input signal and decreases the time for the input signal to traverse the trace, such as a clock line in an integrated circuit.

The input 20 is also coupled to the reference voltage generating circuit 16. The input couples to the Schmitt trigger 84. In the case where the input signal 20 is transitioning from low to high, the strobe signal 22 is initially low and inverted strobe signal 114 is high, transistor 108 is enabled and has it's source coupled to VPWR 112 and transistor 120 is enabled and has it's source 122 coupled to VGND 124. Transistors 92 and 96 then act as an inverter and keep VPWR on output 102, since input signal 20 voltage is well below an NCH threshold voltage of NCH 96. The output of latch 86 holds the state to a logic low and since transmission gates 14 and 18 are still enabled, the reference signal 66 is being driven to VGND. Typically, the strobe timing signal is driven high at a time such that 100 mV of differential voltage is present between signal 38 and signal 66. Once input signal 22 transitions high, transistors 108 and 120 will be disabled. This must be done before the input signal 20 reaches a high enough voltage to trip the Schmitt trigger circuit and set the latch 86 and reference signal to VPWR. Therefore, the Schmitt trigger is set to trip at approximately 80% VPWR on the rising edge of input signal 20 and 20% VPWR on the falling edge of input signal 20, although other levels may be used.

Once sensing of the cross-coupled latch has occurred, as described above, and the output signal 172 is at VPWR, the input must be at a high enough voltage to trip the Schmitt trigger and set the latch to the same state as the reference signal 66, before the strobe signal is driven low. Otherwise, if the strobe signal is driven low f to the input being at a high enough potential, the latch will force the reference back to a logic low, which is incorrect. Therefore, strobe is driven high once the input signal 20 is close to VPWR which will set the output of latch 86 to VPWR, the same state as the reference signal 66. The exact same procedure applies when the input signal 20 transitions from high to low.

Figures 2A, 2B:
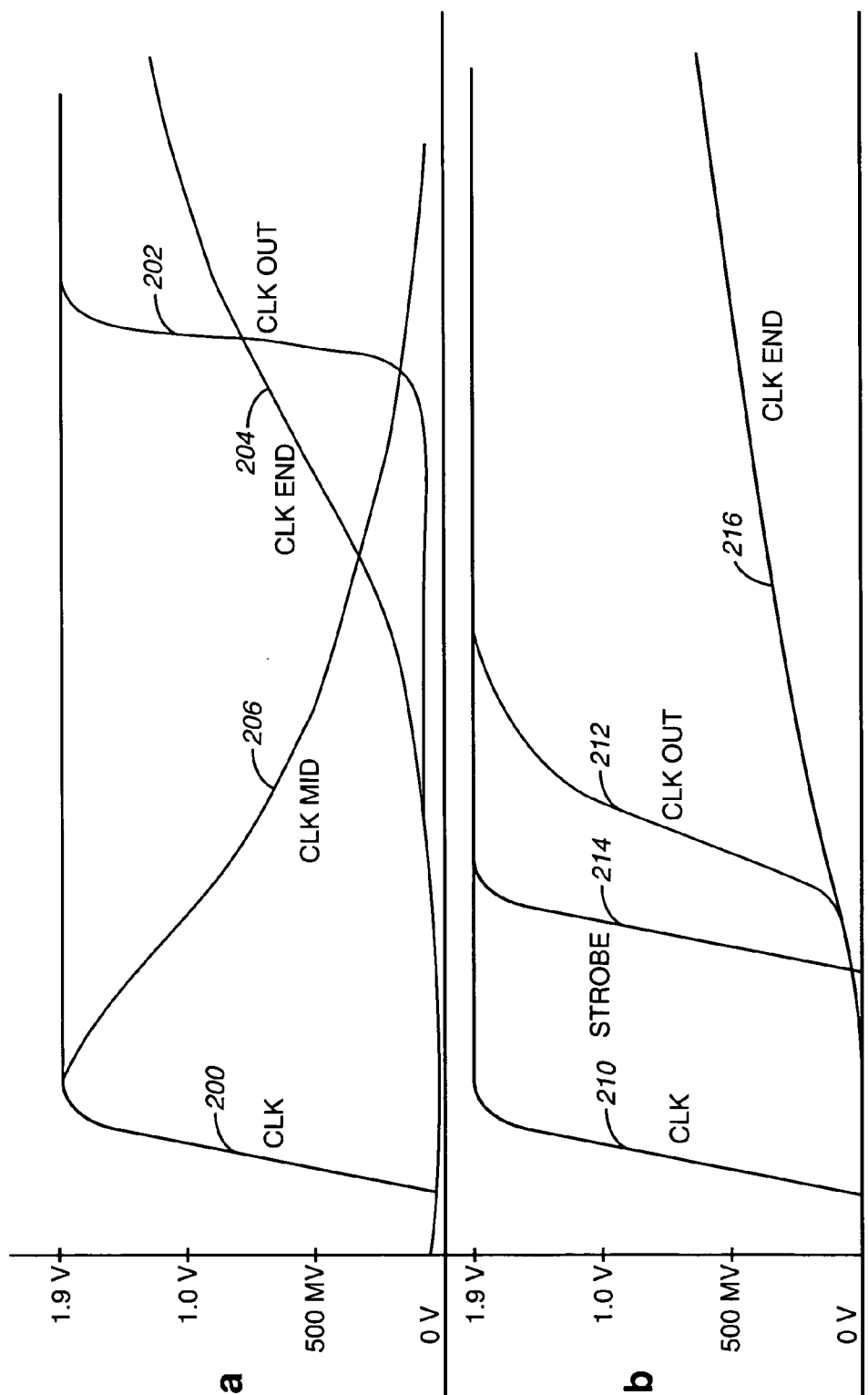
FIG. 2a is graph showing a conventional rising edge clock transmission signal in accordance with one embodiment of the invention.
FIG. 2b is graph showing a rising edge clock transmission signal of the present invention.

FIG. 2a is graph showing a conventional rising edge clock transmission signal in accordance with one embodiment of the invention. The graph shows a simulation of the output of a convenional clock signal from the input of the signal to its destination on a typical integrated circuit. The signal CLK 200 is the rising edge of the clock signal at its input. The CLKOUT 202 is the clock signal seen at the destination on the integrated circuit. The CLKEND 204 signal is the signal seen by the last buffer or amplifier along the trace and the CLKMID 206 is the signal seen by the middle buffer or amplifier. The delay between the CLK 200 and CLKOUT 202 signal is 2.2 nanoseconds in one specific situation. As will be apparent to those skilled in the art other specific situations would result in other delay values.

FIG. 2b is graph showing a rising edge clock transmission signal of the present invention. The CLK 210 is the rising edge of the clock signal at its input. The CLKOUT 212 is the clock signal seen at the destination on the integrated circuit. The delay between the CLK 210 and CLKOUT 212 is 869 picoseconds in one specific situation. As will be apparent to those skilled in the other specific situations would result in other delay values. This is less than half the time for the conventional clock transmission scheme. The strobe signal 214 shows when the cross coupled latch 12 triggers on the CLKEND 216 signal. The CLKEND signal 216 is the signal seen by the cross coupled latch 12. Note that the CLKEND 216 signal is not yet above a transistor threshold when the strobe signal 214 transitions.

Figures 3A, 3B:
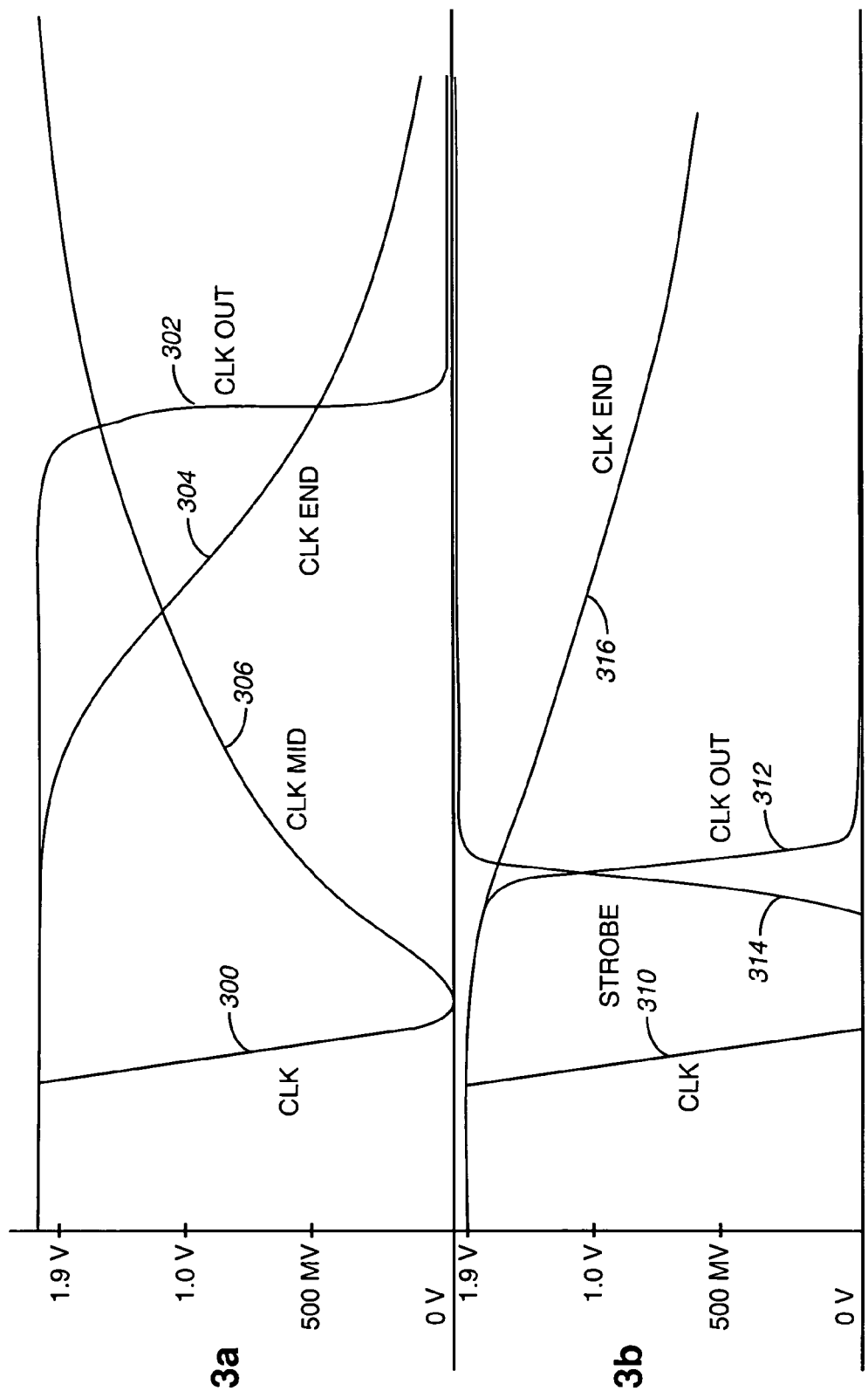
FIG. 3a is graph showing a conventional art falling edge clock transmission signal in accordance with one embodiment of the invention.
FIG. 3b is graph showing a falling edge clock transmission signal of the present invention.

FIG. 3a is graph showing a conventional falling edge clock transmission signal in accordance with one embodiment of the invention. The graph shows a simulation of the output of a conventional clock signal from the input of the signal to its destination on a typical integrated circuit. The signal CLK 300 is the falling edge of the clock signal at its input. The CLKOUT 302 is the clock signal seen at the destination on the integrated circuit. The CLKEND 304 signal is the signal seen by the last buffer or amplifier along the trace and the CLKMID 306 is the signal seen by the middle buffer or amplifier. The delay between the CLK 300 and CLKOUT 302 signal is 2.3 nanoseconds in one specific situation. As will be apparent to those skilled in the art other specific situations would result in other delay values.

FIG. 3b is graph showing a falling edge clock transmission signal of the present invention. The CLK 310 is the falling edge of the clock signal at its input. The CLKOUT 312 is the clock signal seen at the destination on the integrated circuit. The delay between the CLK 210 and CLKOUT 212 is 682 picoseconds in one specific situation. As will be apparent to those skilled in the art other specific situations would result in other delay values. This is less than half the time for the conventional clock transmission scheme. The strobe signal 314 shows when the cross coupled latch 12 triggers on the CLKEND 316 signal. The CLKEND signal 316 is the signal seen by the cross coupled latch 12. Note that the CLKEND 316 signal is not yet threshold below VPWR when the strove signal 314 transitions.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A signal transmission amplifier circuit, comprising:
   a transmission gate having an input coupled to an input signal;
   a cross coupled latch coupled to an output of the transmission gate and having a signal output; and
   a reference generating circuit having an output coupled to provide a reference signal to the cross coupled latch through a second transmission gate, wherein the reference generating circuit includes a latch coupled to a Schmitt trigger.

2. The circuit of claim 1, further including a strobe signal coupled to the transmission gate.

3. The circuit of claim 2, wherein the strobe signal is coupled to the cross coupled latch.

4. The circuit of claim 1 wherein the second transmission gate is between the output of the latch and the cross coupled latch.

5. The circuit of claim 1, wherein the input signal is a single ended input.

6. The circuit of claim 1, wherein the input of the transmission gate is coupled to a transmission line.

7. A signal transmission amplifier circuit, comprising:
   a first transmission gate having an input;
   a first latch coupled to an output of the transmission gate having a reference input;
   a second transmission gate coupled to the reference input; and
   a reference generating circuit having an output coupled to the reference input through a second transmission gate, the reference generating circuit having a latch.

8. The circuit of claim 7, wherein the first latch is a cross coupled latch.

9. The circuit of claim 7, wherein the transmission gate is coupled to a strobe signal and an inverted strobe signal.

10. The circuit of claim 8, wherein the cross coupled latch latches on an input signal having a voltage that is less than a transistor threshold.

11. The circuit of claim 10, wherein the cross coupled latch is coupled to a strobe signal.

12. A signal transmission amplifier circuit, comprising:
    a cross coupled latch having an input;
    a reference voltage generating circuit coupled to provide a reference signal to the cross coupled latch, wherein the reference generating circuit includes a latch;
    a transmission gate coupling to the reference generating circuit to the cross coupled latch; and
    a second transmission gate between the reference voltage generating circuit and the cross coupled latch.

13. The circuit of claim 12, wherein the cross coupled latch has a strobe signal input.

14. The circuit of claim 12, further including a transmission gate coupled between the input of the cross coupled latch and an input signal.

15. The circuit of claim 12, wherein an input signal is a single ended signal.

* * * * *